US008759913B2

(12) United States Patent
Huang et al.

(10) Patent No.: US 8,759,913 B2
(45) Date of Patent: Jun. 24, 2014

(54) DOUBLE DIFFUSED DRAIN METAL OXIDE SEMICONDUCTOR DEVICE AND MANUFACTURING METHOD THEREOF

(75) Inventors: Tsung-Yi Huang, Hsinchu (TW); Ching-Yao Yang, Changhua (TW); Wen-Yi Liao, Hsinchu (TW)

(73) Assignee: Richtek Technology Corporation, Chupei, Hsin-Chu (TW)

( * ) Notice: Subject to any disclaimer, the term of this patent is extended or adjusted under 35 U.S.C. 154(b) by 0 days.

(21) Appl. No.: 13/472,344

(22) Filed: May 15, 2012

(65) Prior Publication Data

US 2013/0307070 A1 Nov. 21, 2013

(51) Int. Cl.
*H01L 29/66* (2006.01)
(52) U.S. Cl.
USPC .......................................... 257/335; 257/343
(58) Field of Classification Search
USPC .......... 438/172; 257/328, 336, 341, 343, 288, 257/335, E29.256
See application file for complete search history.

(56) References Cited

U.S. PATENT DOCUMENTS

| | | | | |
|---|---|---|---|---|
| 2006/0258099 A1* | 11/2006 | Lee et al. | ....................... | 438/258 |
| 2008/0237703 A1* | 10/2008 | Lin et al. | ....................... | 257/336 |
| 2011/0039378 A1* | 2/2011 | Voldman | ....................... | 438/200 |
| 2012/0273878 A1* | 11/2012 | Mallikarjunaswamy | ..... | 257/335 |
| 2013/0020632 A1* | 1/2013 | Disney | ......................... | 257/328 |

* cited by examiner

*Primary Examiner* — Brook Kebede
(74) *Attorney, Agent, or Firm* — Tung & Associates

(57) ABSTRACT

The present invention discloses a double diffused drain metal oxide semiconductor (DDMOS) device and a manufacturing method thereof. The DDDMOS device is formed in a substrate, and includes: a drift region, a gate, a source, a drain, a dielectric layer, and a conductive layer. The drift region includes a first region and a second region. The gate is formed on the substrate, and overlaps the first region from top view. The source and drain are formed at both sides of the gate respectively, and the drain is located in the second region. The drain and the gate are separated by a portion of the second region from top view. The dielectric layer is formed by dielectric material on the gate and the second region. The conductive layer is formed by conductive material on the dielectric layer, and overlaps at least part of the second region from top view.

8 Claims, 6 Drawing Sheets

DOUBLE DIFFUSED DRAIN METAL OXIDE SEMICONDUCTOR DEVICE AND MANUFACTURING METHOD THEREOF

BACKGROUND OF THE INVENTION

1. Field of Invention

The present invention relates to a double diffused drain metal oxide semiconductor (DDDMOS) device and a manufacturing method thereof; particularly, it relates to such DDDMOS device and manufacturing method wherein the breakdown voltage is increased and the band-to-band tunneling effect is mitigated.

2. Description of Related Art

FIGS. 1A-1C show a cross-section view, a 3D (3-dimensional) view, and a top view of a prior art double diffused drain metal oxide semiconductor (DDDMOS) device 100, respectively. As shown in FIGS. 1A and 1B, a field oxide layer 12 is formed in a P-type substrate 11. The field oxide layer 12 for example is a shallow trench isolation (STI) structure or a local oxidation of silicon (LOCOS) structure, the former being shown in the figures. The DDDMOS device 100 includes a gate 13, a drift region 14, a source 15, and a drain 16. The drift region 14, source 15 and the drain 16 are formed by lithography processes and ion implantation processes, wherein the lithography process defines the implantation region by a photoresist mask together with a self-alignment effect provided by all or part of the gate 13, and the ion implantation implants N-type impurities to the defined region in the form of accelerated ions. The source 15 and the drain 16 are beneath the gate 13 and at different sides thereof respectively. The drift region 14 is located at the same side of the drain 16, and part of the drift region 14 is beneath the gate 13. FIG. 1C is a top view of the DDDMOS device 100 showing the relative locations of the aforementioned regions of the DDDMOS device 100, and further showing the relative locations of a conductive plug 18 and a first metal layer 19. As shown in FIG. 1C, in order to reduce the antenna effect, the locations of the conductive plug 18 and the first metal layer 19 are located outside a device region 12a (indicated by a thick border) which is defined by the field oxide layer 12 surrounding the DDDMOS device 100.

The DDDMOS device is a high voltage device designed for applications requiring higher operation voltages. However, if it is required for the DDDMOS device to be integrated with a low voltage device in one substrate, the DDDMOS device and the low voltage device should adopt the same manufacturing process steps with the same ion implantation parameters, and thus the flexibility of the ion implantation parameters for the DDDMOS device is limited; as a result, the DDDMOS device will have a lower breakdown voltage at the junction between the p-type substrate 11 and a side of the n-type drift region 14. Besides, when the DDDMOS device 100 operates in a high electric field, the energy band is bended, such that carriers with sufficient energy may tunnel from the conduction band to the valance band at the junction depletion region when the conduction band and the valance band are close enough, i.e., the leakage current induced by the band-to-band tunneling (BTBT) effect will greatly increase. As the device dimension keeps decreasing, the leakage current induced by the BTBT effect is not ignorable. Therefore, the application range of the DDDMOS device is limited under such process condition. To increase the breakdown voltage and to mitigate the BTBT effect of the DDDMOS device, additional manufacturing process steps are required, that is, at least an additional lithography process and an additional ion implantation process are required in order to provide different ion implantation parameters, but this increases the cost. FIGS. 2A and 2B respectively show simulated level contours and current-voltage characteristics of a prior art 6V DDDMOS device in a reversely biased condition. As shown in FIG. 2B, the prior art 6V DDDMOS device has a breakdown voltage around 18.7V, and the BTBT effect induced leakage current is obvious when the operation voltage is higher than 16.5V at reversely biased condition. A comparison between this prior art and the present invention having the same operation voltage (6V) will be illustrated later.

In view of above, to overcome the drawbacks in the prior art, the present invention proposes a DDDMOS device and a manufacturing method thereof which increases the breakdown voltage and mitigates the BTBT effect so that the DDDMOS device may have a broader application range, in which additional manufacturing process steps are not required such that the DDDMOS device can be integrated with and a low voltage device and manufactured by common manufacturing process steps.

SUMMARY OF THE INVENTION

A first objective of the present invention is to provide a double diffused drain metal oxide semiconductor (DDDMOS) device.

A second objective of the present invention is to provide a manufacturing method of a DDDMOS device.

To achieve the objectives mentioned above, from one perspective, the present invention provides a DDDMOS device, which is formed in a first conductive type substrate, wherein the substrate has an upper surface. The DDDMOS device comprises: a second conductive type drift region formed beneath the upper surface, the drift region including a first region and a second region; agate formed on the upper surface, wherein the first region is located beneath the gate; a second conductive type source and a second conductive type drain formed at two sides of the gate beneath the upper surface respectively, wherein the drain is located in the second region, and the drain and the gate are separated by part of the second region from top view; a dielectric layer formed on both the gate and the second region; and a conductive layer formed on the dielectric layer, which overlaps at least part of the second region between the gate and the drain from top view.

From another perspective, the present invention provides a manufacturing method of a DDDMOS device, including: providing a first conductive type substrate wherein the substrate has an upper surface; forming a second conductive type drift region beneath the upper surface, the drift region including a first region and a second region; forming a gate on the upper surface, wherein the first region is located beneath the gate; forming a second conductive type source and a second conductive type drain at two sides of the gate beneath the upper surface respectively, wherein the drain is located in the second region, and the drain and the gate are separated by part of the second region from top view; forming a dielectric layer on the gate and the second region; and forming a conductive layer on the dielectric layer, which overlaps at least part of the second region between the gate and the drain from top view.

In one preferable embodiment of the aforementioned DDDMOS device, the conductive layer is electrically connected to the gate.

In another preferable embodiment, the conductive layer extends across a device region in a width direction of the DDDMOS device from top view, wherein the device region is defined by a field oxide layer surrounding the DDDMOS device.

In the DDDMOS device, the conductive layer preferably overlaps at least part of the gate from top view.

In another preferably embodiment of the DDDMOS device, the conductive layer is formed by a process step which also forms a first metal layer of the DDDMOS device.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the regions and the process steps, but not drawn according to actual scale.

Figure 3A:
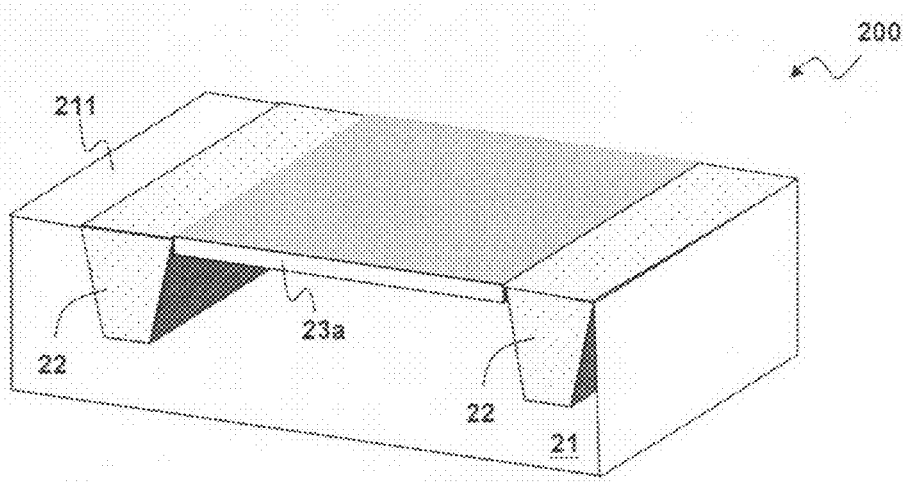
FIGS. 3A-3F show a first embodiment of the present invention.
Figure 3B:
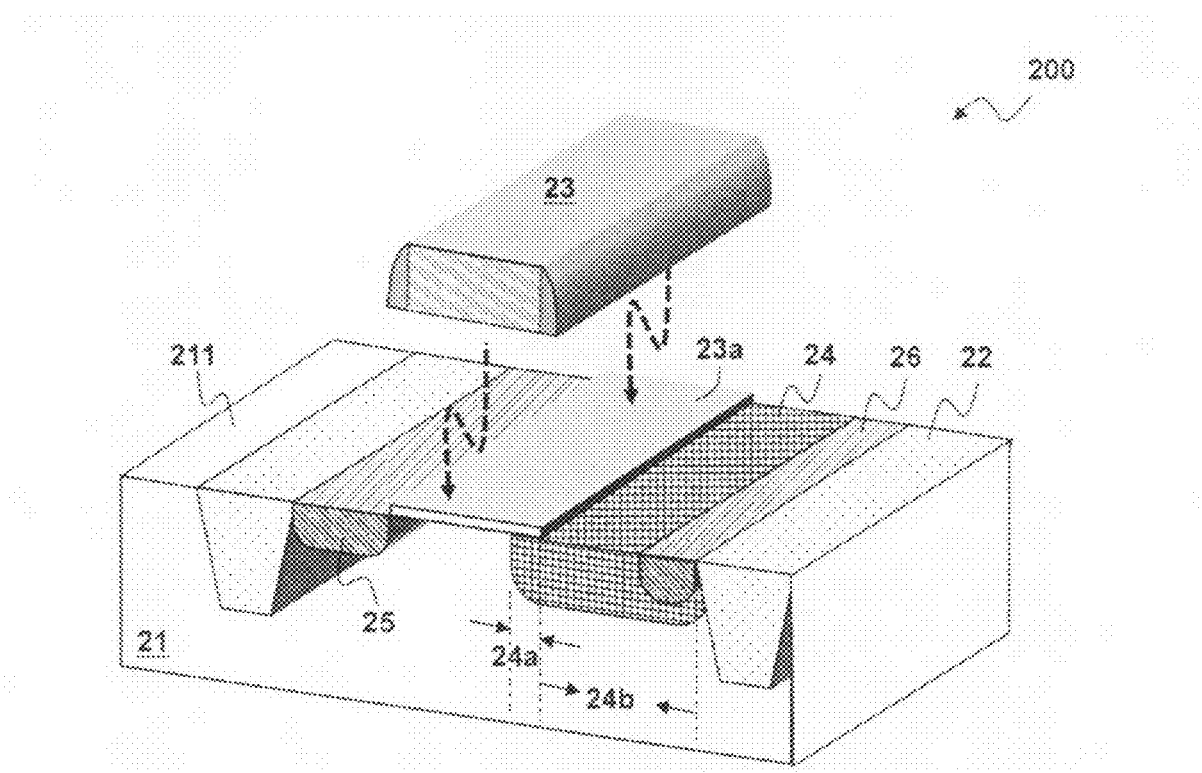

Please refer to FIGS. 3A-3F for a first embodiment according to the present invention, wherein FIGS. 3A-3E are 3D schematic diagrams showing a manufacturing method of a DDDMOS device 200 according to the present invention. It should be noted that, in order to better illustrate the major feature of the present invention, a gate 23 and a gate dielectric layer 23a on a substrate 21 are shown separately in FIG. 3B, but they should be in contact with each other in a practical device. As shown in FIG. 3A, in the substrate 21, field oxide regions 22 are formed to define a device region (the device region is surrounded by the field oxide regions 22 from top view, not shown), wherein the substrate 21 is, for example but not limited to, a P-type substrate (or an N-type substrate in another embodiment), and the field oxide region 22 is, for example, an STI or a LOCOS structure (the former being shown in FIG. 3A). And as shown in FIG. 3A, the gate dielectric layer 23a is formed on an upper surface 211 of the substrate 21 by for example but not limited to an oxidation process. Next, as shown in FIG. 3B, the gate 23 is formed on the upper surface 211; and a drift region 24, a source 25 and a drain 26 are formed beneath the upper surface 211 by lithography processes and ion implantation processes, wherein the lithography process defines the implantation region by a photoresist mask together with a self-alignment effect provided by all or part of the gate 23, and the ion implantation implants N-type impurities to the defined region in the form of accelerated ions. The source 25 and the drain 26 are beneath the gate 23 and at different sides thereof respectively. The drain 26 is located in a second region 26b of the drift region 24; and the drain 26 and the gate 23 are separated by the second region 24b; and a first region 24a of the drift region 24 is located beneath the gate 23.

Figure 3C:
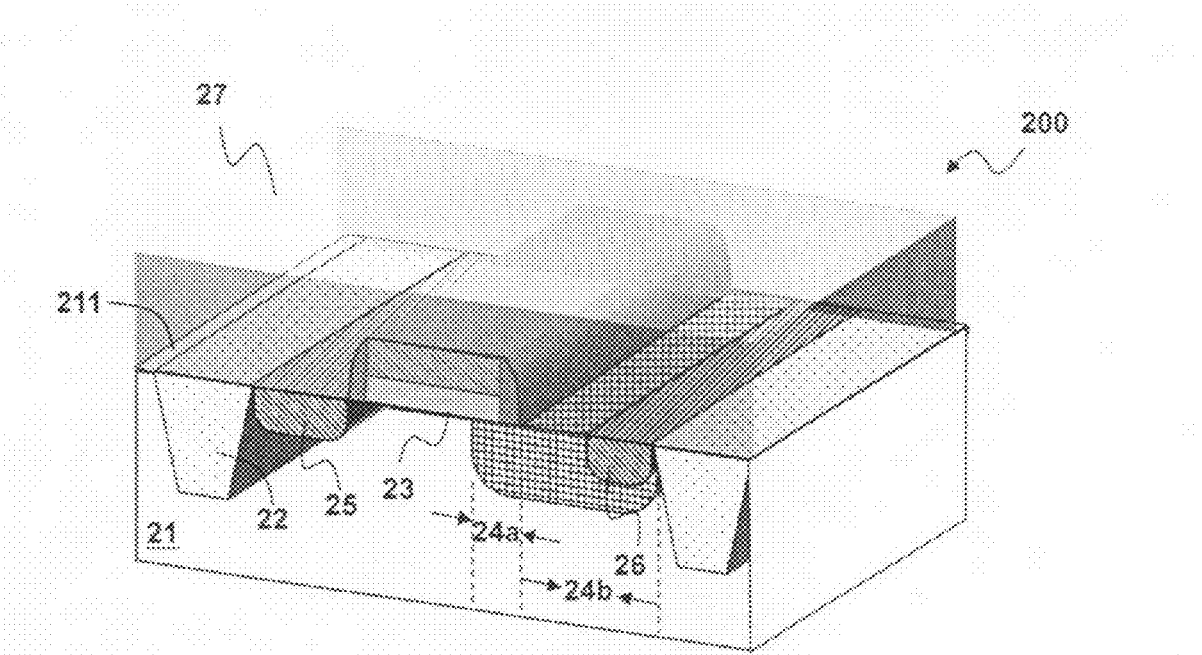
Figure 3D:
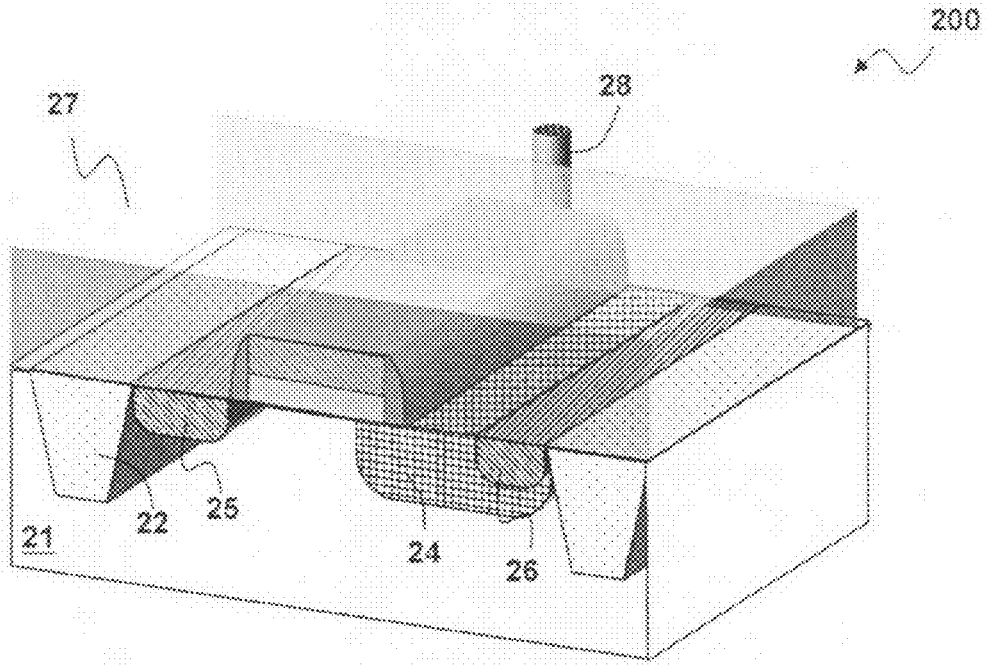
Figure 3E:
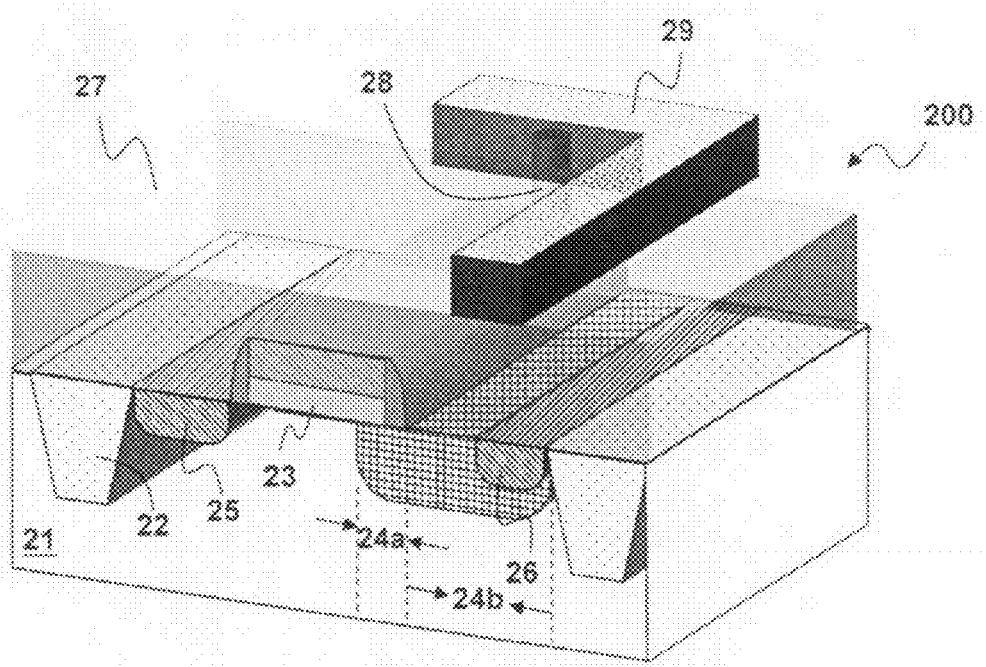
Figure 3F:
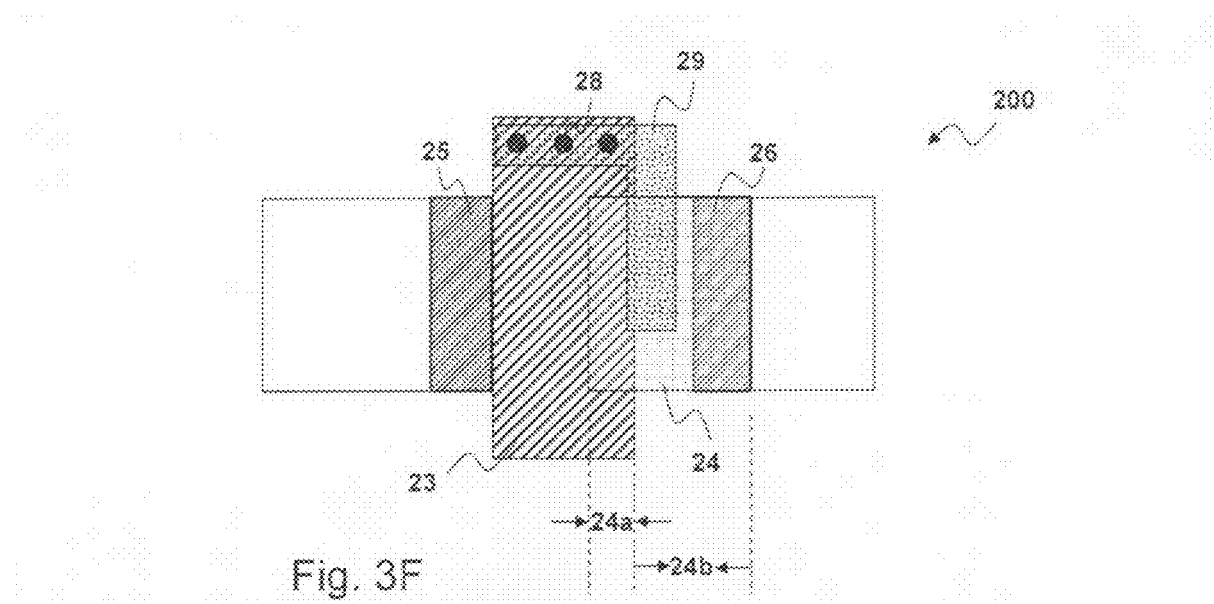

Next, as shown in FIG. 3C, a dielectric layer 27 made of a dielectric material is formed by a deposition process. The dielectric layer 27 is formed on the upper surface 211 and the gate 23, and the dielectric layer 27 covers substantially all over the DDDMOS device 200, including the gate 23 and the second region 24b. As shown in FIG. 3D, a conductive plug 28 is formed by for example but not limited to a lithography process, an etching process, a deposition process, and a chemical mechanical polishing (CMP) process, etc. Note that in order to better illustrate the major feature of the present invention, a single conductive plug 38 is shown in FIG. 3D, but the quantity of the conductive plug 38 may be plural, and it may be in contact with the gate 23 directly, or arranged outside the device region in a practical device. FIGS. 3E and 3F show a 3D view and a top view of the complete DDDMOS device 200 respectively. As shown in FIG. 3E, a conductive layer 29 made of conductive material is formed on the dielectric layer 27 by for example but not limited to a lithography process, a deposition process, and an etching process. The conductive material is for example but not limited to metal, such as aluminum or copper. The conductive layer 29 is formed by a process step which also forms for example but not limited to a first metal layer of the DDDMOS device (not shown). Note that, as shown in top view FIG. 3F, the conductive layer 29 overlaps at least part of the second region 24b between the gate 23 and the drain 26 from top view This embodiment is different from the prior art in that, the DDDMOS device 200 of this embodiment includes the conductive layer 29 which is formed on the dielectric layer 28 and overlaps at least part of the second region 24b of the drift region 24 from top view. This embodiment is advantageous over the prior art in that, by the conductive layer 29 which is formed on the dielectric layer 27 and overlaps at least part of the second region 24b, no matter whether the DDDMOS device 200 of this embodiment operates in an ON or OFF condition, the conductive layer 29 generates an electric field, which modifies an electric field in a channel of the DDDMOS device 200 through the dielectric layer 27, such that when the DDDMOS device 200 operates in the ON condition, a gate induced drain leakage (GIDL) current can be decreased, and when the DDDMOS device 200 operates in the OFF condition, the BTBT effect can be mitigated; furthermore, this embodiment also increases the breakdown voltage of the DDDMOS device 200.

Figure 1A:
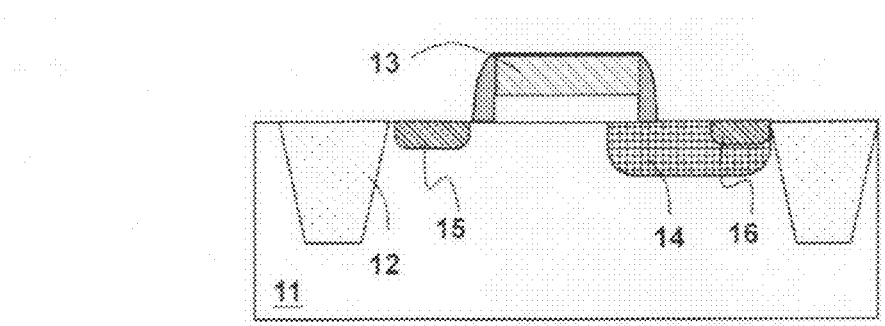
FIGS. 1A-1C show a cross-section view, a 3D (3-dimensional) view, and a top view of a prior art double diffused drain metal oxide semiconductor (DDDMOS) device 100, respectively.
Figure 1B:
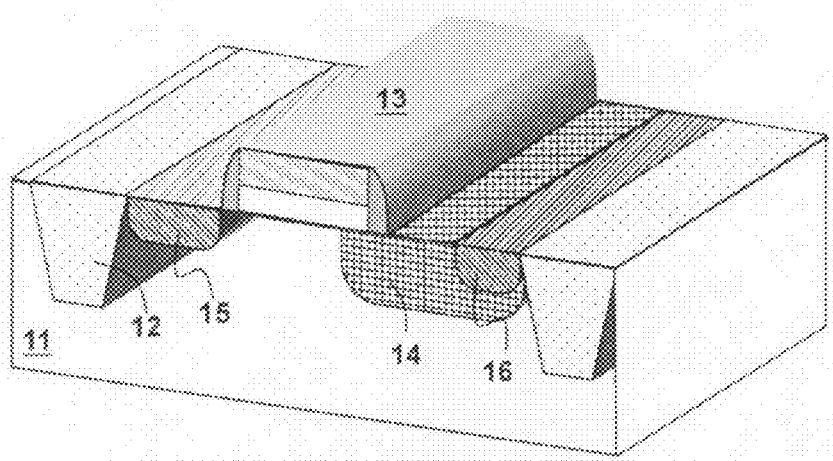
Figure 1C:
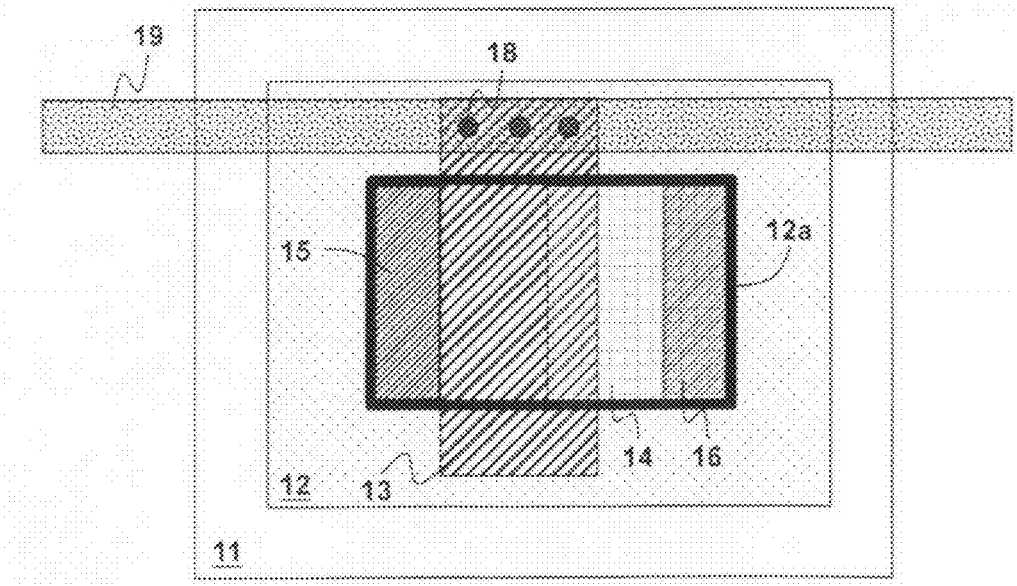
Figure 2A:
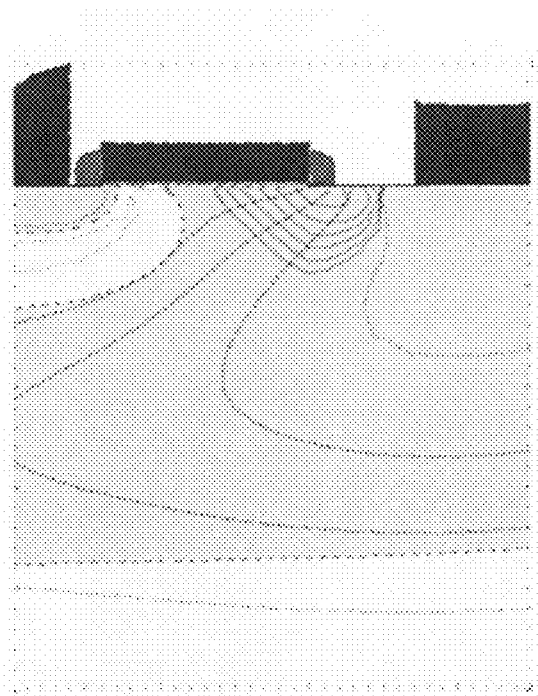
FIGS. 2A and 2B show simulated level contours and current-voltage characteristics of a prior art 6V DDMOS device in a reversely biased condition, respectively.
Figure 2B:
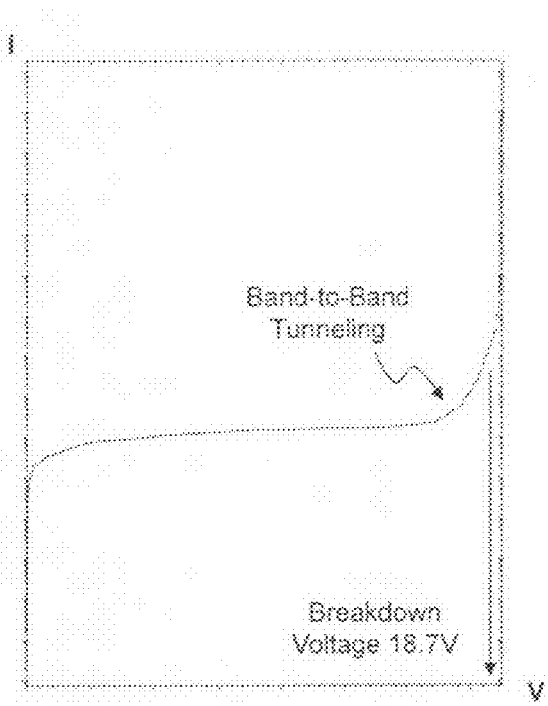
Figure 4A:
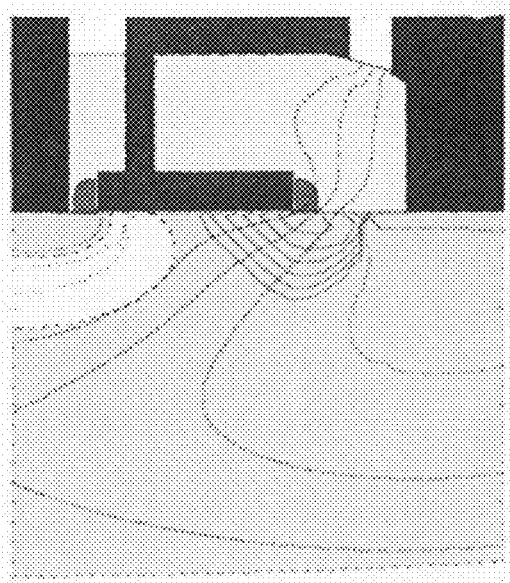
FIGS. 4A and 4B show simulated level contours and current-voltage characteristics of the present invention 6V DDMOS device in a reversely biased condition, respectively.
Figure 4B:
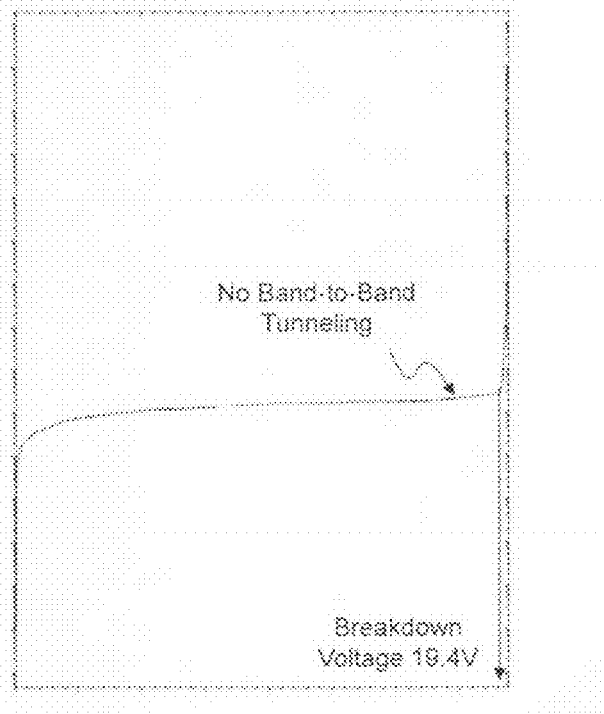

Comparing FIGS. 2A and 2B with FIGS. 4A and 4B, wherein FIGS. 2A and 2B show simulated level contours and current-voltage characteristics of the prior art 6V DDMOS device in the reversely biased condition respectively, and FIGS. 4A and 4B show simulated level contours and current-voltage characteristics of the present invention 6V DDMOS device in the reversely biased condition respectively, it can be clearly seen that the 6V DDDMOS device of the present invention has a lower density of the level contours, such that the electric field is relatively low and the breakdown voltage is relatively high, and the BTBT effect is mitigated. Comparing FIG. 2B with FIG. 4B, the breakdown voltage of the prior art 6V DDMOS device is around 18.7V, and the BTBT effect induced leakage current is obvious when the operation voltage is higher than 16.5V at reversely biased condition; on the other hand, the 6V DDMOS device according to the present invention has an improved breakdown voltage around 19.4V, and no obvious leakage current is induced by the BTBT effect before the occurrence of the device breakdown. Besides, in this embodiment, the conductive layer 29 is formed by the process step which also forms the first metal layer of the DDDMOS device. The advantage of this arrangement is that no additional process step or mask is required, so the manufacturing cost is not increased.

Figure 5A:
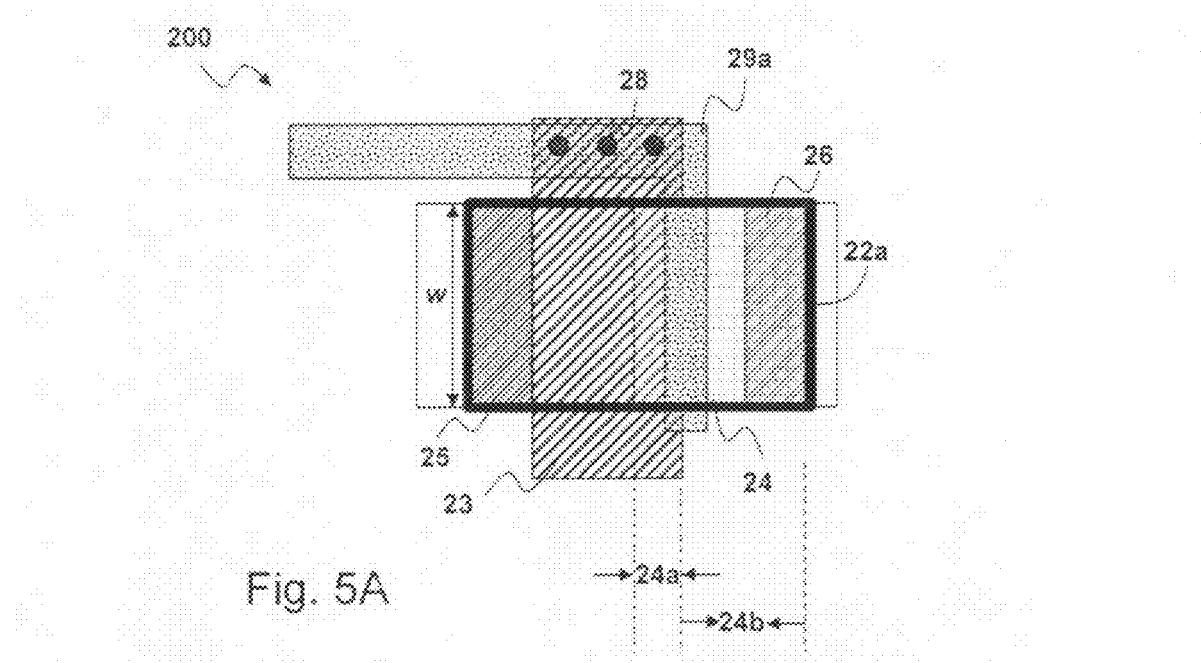
FIGS. 5A-5C are top views showing different embodiments of conductive layers of a DDDMOS device 200 in the present invention.
Figures 5B, 5C:
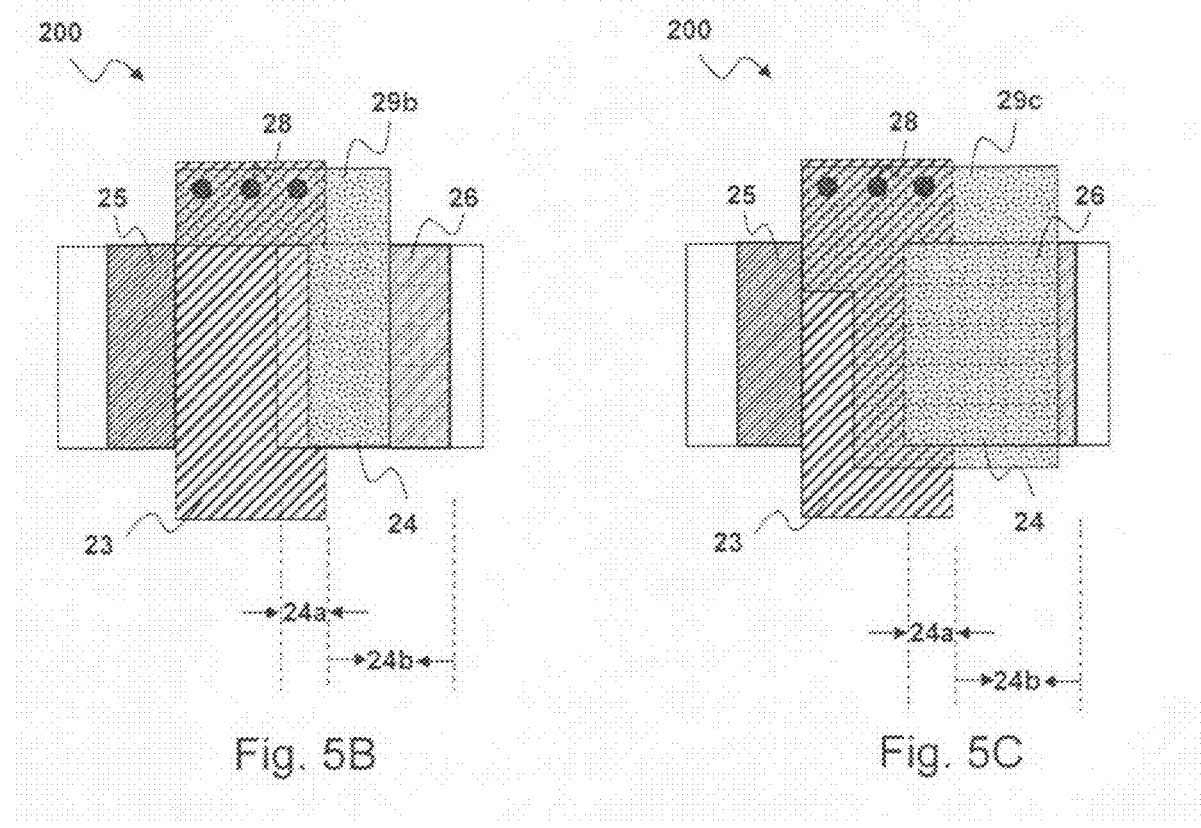

FIGS. 5A-5C are top views showing different embodiments of conductive layers 29a, 29b, and 29c of the DDDMOS device 200 in the present invention. FIG. 5A shows that a device region 22a (indicated by a thick border in the figure) has a width w, wherein the device region 22a is defined by the field oxide regions 22 (not shown in this figure; please refer to FIG. 3E) surrounding the DDDMOS device 200. In this embodiment, the conductive layer 29a extends across the device region 22a in the width w direction of the DDDMOS device 200 from the top view of FIG. 5A. FIG. 5B shows that the conductive layer 29b may overlap at least part of the gate 23 from top view. FIG. 5C shows that the conductive layer 29c may be any shape, as long as it overlaps at least part of the second region 24b from top view. In fact, the conductive layer 29c may overlap the gate 23, the drift region 24, and the drain 26 from top view, as long as it is within the tolerance allowed by the antenna effect.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristics of the device, such as a deep well, etc., can be added; for another example, the lithography step described in the above can be replaced by electron beam lithography, X-ray lithography, etc.; for yet another example, the drift regions, the sources, and the drains of the aforementioned embodiments are not limited to N-type, and the substrates of the aforementioned embodiments are not limited to P-type, but they may be interchanged, with proper modifications of their impurities and the impurities of other regions; for another example, the location of the conductive plug is not limited to outside the device region, and it may for example be inside the device region, etc. In view of the foregoing, the spirit of the present invention should cover all such and other modifications and variations, which should be interpreted to fall within the scope of the following claims and their equivalents.

What is claimed is:

1. A double diffused drain metal oxide semiconductor (DDDMOS) device formed in a first conductive type substrate, wherein the substrate has an upper surface, the DDDMOS device comprising:
    a second conductive type drift region formed beneath the upper surface, the drift region including a first region and a second region;
    a gate formed on the upper surface, wherein the first region is located beneath the gate;
    a second conductive type source and a second conductive type drain formed at two sides of the gate beneath the upper surface respectively, wherein the drain is located in the second region, and the drain and the gate are separated by part of the second region from top view;
    a dielectric layer formed on both the gate and the second region; and
    a conductive layer formed on the dielectric layer, which overlaps at least part of the second region between the gate and the drain from top view;
    wherein the conductive layer extends across a device region in a width direction perpendicular to a channel direction of the DDDMOS device from top view, wherein the device region is defined by a field oxide layer surrounding the DDDMOS device.

2. The DDDMOS device of claim 1, wherein the conductive layer is electrically connected to the gate.

3. The DDDMOS device of claim 2, wherein the conductive layer overlaps at least part of the gate from top view.

4. The DDDMOS device of claim 1, wherein the conductive layer is formed by a process step which also forms a first metal layer of the DDDMOS device.

5. A manufacturing method of a DDDMOS device comprising:
    providing a first conductive type substrate wherein the substrate has an upper surface;
    forming a second conductive type drift region beneath the upper surface, the drift region including a first region and a second region;
    forming a gate on the upper surface, wherein the first region is located beneath the gate;
    forming a second conductive type source and a second conductive type drain at two sides of the gate beneath the upper surface respectively, wherein the drain is located in the second region, and the drain and the gate are separated by part of the second region from top view;
    forming a dielectric layer on the gate and the second region; and
    forming a conductive layer on the dielectric layer, which overlaps at least part of the second region between the gate and the drain from top view;
    wherein the conductive layer extends across a device region in a width direction perpendicular to a channel direction of the DDDMOS device from top view, wherein the device region is defined by a field oxide layer surrounding the DDDMOS device.

6. The manufacturing method of claim 5, wherein the conductive layer is electrically connected to the gate.

7. The manufacturing method of claim 6, wherein the conductive layer overlaps at least part of the gate from top view.

8. The manufacturing method of claim 6, wherein the conductive layer is formed by a process step which also forms a first metal layer of the DDDMOS device.

* * * * *